(12) United States Patent
Sugime (10) Patent No.: US 11,757,536 B2
(45) Date of Patent: Sep. 12, 2023

(54) POWER OVER FIBER SYSTEM

(71) Applicant: KYOCERA CORPORATION, Kyoto (JP)

(72) Inventor: Tomonori Sugime, Yokohama (JP)

(73) Assignee: KYOCERA CORPORATION, Kyoto (JP)

(*) Notice: Subject to any disclaimer, the term of this patent is extended or adjusted under 35 U.S.C. 154(b) by 27 days.

(21) Appl. No.: 17/620,061

(22) PCT Filed: Jun. 26, 2020

(86) PCT No.: PCT/JP2020/025374
§ 371 (c)(1),
(2) Date: Dec. 16, 2021

(87) PCT Pub. No.: WO2021/019995
PCT Pub. Date: Feb. 4, 2021

(65) Prior Publication Data
US 2022/0360344 A1 Nov. 10, 2022

(30) Foreign Application Priority Data
Jul. 26, 2019 (JP) ................................. 2019-137382

(51) Int. Cl.
*H04B 10/80* (2013.01)
*H02J 50/30* (2016.01)
*H01S 5/022* (2021.01)

(52) U.S. Cl.
CPC ........... *H04B 10/807* (2013.01); *H01S 5/022* (2013.01); *H02J 50/30* (2016.02)

(58) Field of Classification Search
None
See application file for complete search history.

(56) References Cited

U.S. PATENT DOCUMENTS

| 6,980,322 B1* | 12/2005 | Hamada | G03G 15/326 |
| | | | 358/1.7 |
| 2005/0213894 A1* | 9/2005 | Su | G02B 6/4201 |
| | | | 385/88 |
| 2005/0226625 A1* | 10/2005 | Wake | H04B 10/25753 |
| | | | 398/115 |
| 2006/0169914 A1* | 8/2006 | Holle | H01J 49/164 |
| | | | 250/423 P |

FOREIGN PATENT DOCUMENTS

| JP | 2000152523 A | 5/2000 |
| JP | 2010135989 A | 6/2010 |
| JP | 201740905 A | 2/2017 |

* cited by examiner

*Primary Examiner* — David W Lambert
(74) *Attorney, Agent, or Firm* — HAUPTMAN HAM, LLP

(57) ABSTRACT

A power over fiber system includes a power sourcing equipment, a powered device, an optical fiber cable and a converter. The power sourcing equipment includes a semiconductor laser that oscillates with electric power, thereby outputting feed light. The powered device includes a photoelectric conversion element that converts the feed light into electric power. The optical fiber cable has one end connectable to the power sourcing equipment and another end connectable to the powered device to transmit the feed light. The converter converts a wavelength of the feed light.

16 Claims, 10 Drawing Sheets

FIG. 13 ated to a power source, and electrically drives the semiconductor laser 111 and so forth.

POWER OVER FIBER SYSTEM

RELATED APPLICATIONS

The present application is a National Phase of International Application No. PCT/JP2020/025374, filed Jun. 26, 2020, which claims priority to Japanese Application No. 2019-137382, filed Jul. 26, 2019.

TECHNICAL FIELD

The present disclosure relates to a power over fiber system.

BACKGROUND ART

Recently, there has been studied an optical power supply system that converts electric power into light (called feed light), transmits the feed light, converts the feed light into electric energy, and uses the electric energy as electric power.

There is disclosed in Patent Literature 1 an optical communication device that includes: an optical transmitter that transmits signal light modulated with an electric signal and feed light for supplying electric power; an optical fiber including a core that transmits the signal light, a first cladding that is formed around the core, has a refractive index lower than that of the core, and transmits the feed light, and a second cladding that is formed around the first cladding, and has a refractive index lower than that of the first cladding; and an optical receiver that operates with electric power obtained by converting the feed light transmitted through the first cladding of the optical fiber, and converts the signal light transmitted through the core of the optical fiber into the electric signal.

CITATION LIST

Patent Literature

Patent Literature 1: JP 2010-135989 A

SUMMARY OF INVENTION

Problem to Solve

In optical power supply, further improvement of optical power supply efficiency is required. As one way therefor, improvement of photoelectric conversion efficiency at the power supplying side and the power receiving side is required.

Solution to Problem

A power over fiber system of an aspect of the present disclosure includes:
a power sourcing equipment including a semiconductor laser that oscillates with electric power, thereby outputting feed light;
a powered device including a photoelectric conversion element that converts the feed light into electric power;
an optical fiber cable having one end connectable to the power sourcing equipment and another end connectable to the powered device to transmit the feed light; and
a converter that converts a wavelength of the feed light.

DESCRIPTION OF EMBODIMENTS

Hereinafter, embodiments of the present disclosure will be described with reference to the drawings.

(1) Outline of System

First Embodiment

Figure 1:
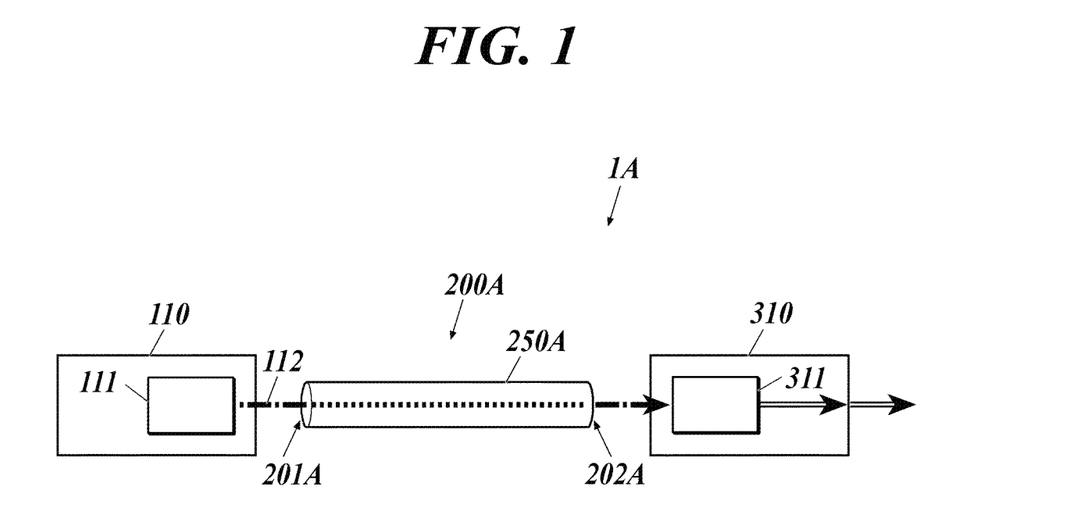
FIG. 1 is a block diagram of a power over fiber system according to a first embodiment of the present disclosure.

As shown in FIG. 1, a power over fiber (PoF) system 1A of this embodiment includes a power sourcing equipment (PSE) 110, an optical fiber cable 200A and a powered device (PD) 310.

In the present disclosure, a power sourcing equipment converts electric power into optical energy and supplies (sources) the optical energy, and a powered device receives (draws) the supplied optical energy and converts the optical energy into electric power.

The power sourcing equipment 110 includes a semiconductor laser 111 for power supply.

The optical fiber cable 200A includes an optical fiber 250A that forms a transmission path of feed light.

The powered device 310 includes a photoelectric conversion element 311.

The power sourcing equipment 110 is connected to a power source, and electrically drives the semiconductor laser 111 and so forth.

The semiconductor laser 111 oscillates with the electric power from the power source, thereby outputting feed light 112.

The optical fiber cable 200A has one end 201A connectable to the power sourcing equipment 110 and the other end 202A connectable to the powered device 310 to transmit the feed light 112.

The feed light 112 from the power sourcing equipment 110 is input to the one end 201A of the optical fiber cable 200A, propagates through the optical fiber 250A, and is output from the other end 202A of the optical fiber cable 200A to the powered device 310.

The photoelectric conversion element 311 converts the feed light 112 transmitted through the optical fiber cable 200A into electric power. The electric power obtained by the conversion of the feed light 112 by the photoelectric conversion element 311 is driving power needed in the powered device 310. The powered device 310 is capable of outputting, for an external device(s), the electric power obtained by the conversion of the feed light 112 by the photoelectric conversion element 311.

Semiconductor materials of semiconductor regions of the semiconductor laser 111 and the photoelectric conversion element 311 are semiconductors having a laser wavelength being a short wavelength of 500 nm or less. The semiconductor regions exhibit light-electricity conversion effect.

Semiconductors having a laser wavelength being a short wavelength have a large band gap and a high photoelectric conversion efficiency, and hence improve photoelectric conversion efficiency at the power supplying side and the power receiving side in optical power supply, and improve optical power supply efficiency.

Hence, as the semiconductor materials, laser media having a laser wavelength (base wave) of 200 nm to 500 nm may be used. Examples thereof include diamond, gallium oxide, aluminum nitride and gallium nitride.

Further, as the semiconductor materials, semiconductors having a band gap of 2.4 eV or greater are used.

For example, laser media having a band gap of 2.4 eV to 6.2 eV may be used. Examples thereof include diamond, gallium oxide, aluminum nitride and gallium nitride.

Laser light having a longer wavelength tends to have a higher transmission efficiency, whereas laser light having a shorter wavelength tends to have a higher photoelectric conversion efficiency. Hence, when laser light is transmitted for a long distance, laser media having a laser wavelength (base wave) of greater than 500 nm may be used as the semiconductor materials, whereas when the photoelectric conversion efficiency is given priority, laser media having a laser wavelength (base wave) of less than 200 nm may be used as the semiconductor materials.

Any of these semiconductor materials may be used in one of the semiconductor laser 111 and the photoelectric conversion element 311. This improves the photoelectric conversion efficiency at either the power supplying side or the power receiving side, and improves the optical power supply efficiency.

Second Embodiment

Figure 2:
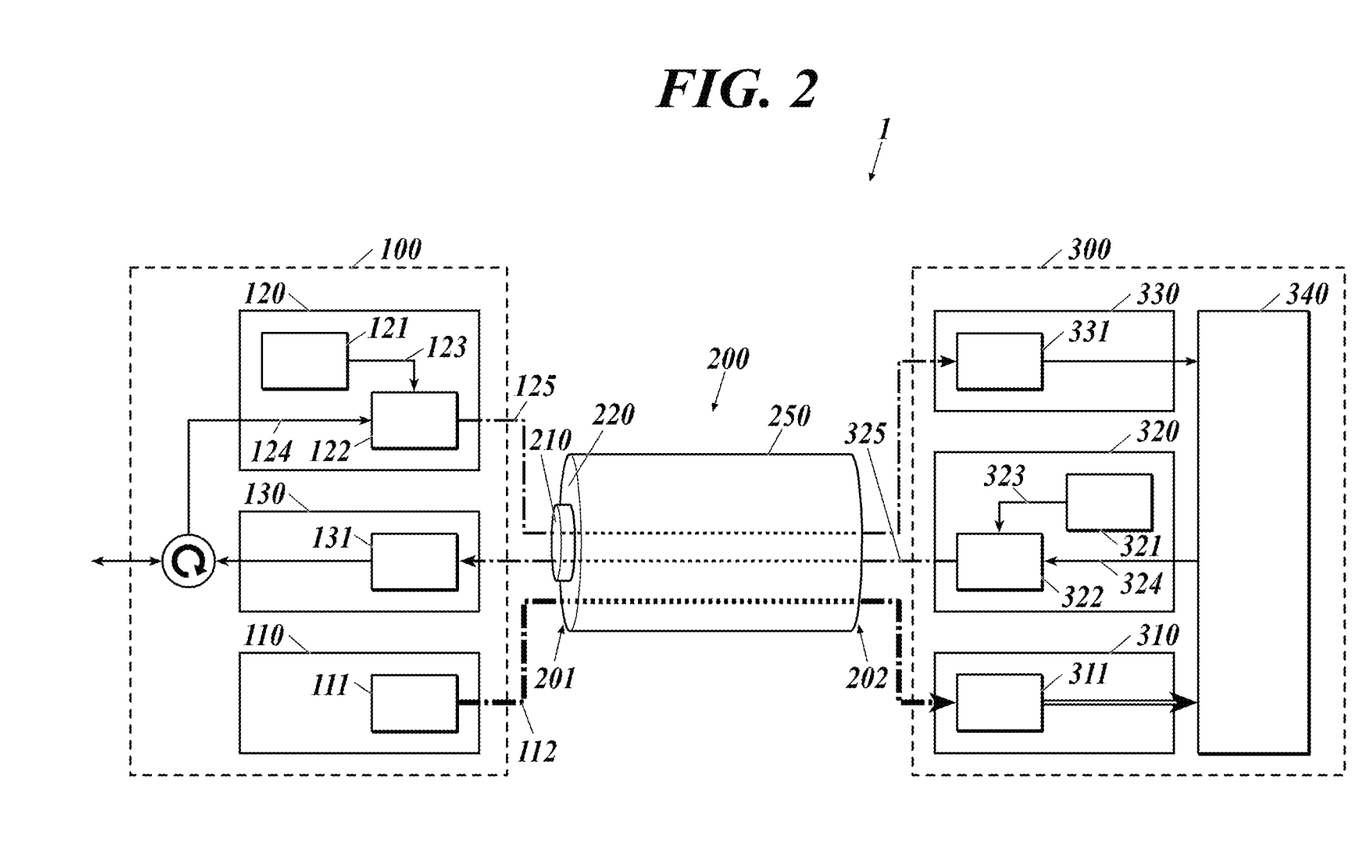
FIG. 2 is a block diagram of a power over fiber system according to a second embodiment of the present disclosure.

As shown in FIG. 2, a power over fiber (PoF) system 1 of this embodiment includes an optical power supply system through an optical fiber and an optical communication system therethrough, and includes: a first data communication device 100 including a power sourcing equipment (PSE) 110; an optical fiber cable 200; and a second data communication device 300 including a powered device (PD) 310.

In the following description, as a general rule, components donated by the same reference signs as those of already-described components are the same as the already-described components unless otherwise stated.

The power sourcing equipment 110 includes a semiconductor laser 111 for power supply. The first data communication device 100 includes, in addition to the power sourcing equipment 110, a transmitter 120 and a receiver 130 for data communication. The first data communication device 100 corresponds to a data terminal equipment (DTE), a repeater or the like. The transmitter 120 includes a semiconductor laser 121 for signals and a modulator 122. The receiver 130 includes a photodiode 131 for signals.

The optical fiber cable 200 includes an optical fiber 250 including: a core 210 that forms a transmission path of signal light; and a cladding 220 that is arranged so as to surround the core 210 and forms a transmission path of feed light.

The powered device 310 includes a photoelectric conversion element 311. The second data communication device 300 includes, in addition to the powered device 310, a transmitter 320, a receiver 330 and a data processing unit 340. The second data communication device 300 corresponds to a power end station or the like. The transmitter 320 includes a semiconductor laser 321 for signals and a modulator 322. The receiver 330 includes a photodiode 331 for signals. The data processing unit 340 processes received signals. The second data communication device 300 is a node in a communication network. The second data communication device 300 may be a node that communicates with another node.

The first data communication device 100 is connected to a power source, and electrically drives the semiconductor laser 111, the semiconductor laser 121, the modulator 122, the photodiode 131 and so forth. The first data communication device 100 is a node in a communication network. The first data communication device 100 may be a node that communicates with another node.

The semiconductor laser 111 oscillates with the electric power from the power source, thereby outputting feed light 112.

The photoelectric conversion element 311 converts the feed light 112 transmitted through the optical fiber cable 200 into electric power. The electric power obtained by the conversion of the feed light 112 by the photoelectric conversion element 311 is driving power needed in the second data communication device 300, for example, driving power for the transmitter 320, the receiver 330 and the data processing unit 340. The second data communication device 300 may be capable of outputting, for an external device(s), the electric power obtained by the conversion of the feed light 112 by the photoelectric conversion element 311.

The modulator 122 of the transmitter 120 modulates laser light 123 output by the semiconductor laser 121 to signal light 125 on the basis of transmission data 124, and outputs the signal light 125.

The photodiode 331 of the receiver 330 demodulates the signal light 125 transmitted through the optical fiber cable 200 to an electric signal, and outputs the electric signal to the data processing unit 340. The data processing unit 340 transmits data of the electric signal to a node, and also receives data from the node and outputs the data to the modulator 322 as transmission data 324.

The modulator 322 of the transmitter 320 modulates laser light 323 output by the semiconductor laser 321 to signal light 325 on the basis of the transmission data 324, and outputs the signal light 325.

The photodiode 131 of the receiver 130 demodulates the signal light 325 transmitted through the optical fiber cable 200 to an electric signal, and outputs the electric signal. Data of the electric signal is transmitted to a node, whereas data from the node is the transmission data 124.

The feed light 112 and the signal light 125 from the first data communication device 100 are input to one end 201 of the optical fiber cable 200, propagate through the cladding 220 and the core 210, respectively, and are output from the other end 202 of the optical fiber cable 200 to the second data communication device 300.

The signal light 325 from the second data communication device 300 is input to the other end 202 of the optical fiber cable 200, propagates through the core 210, and is output from the one end 201 of the optical fiber cable 200 to the first data communication device 100.

Figure 3:
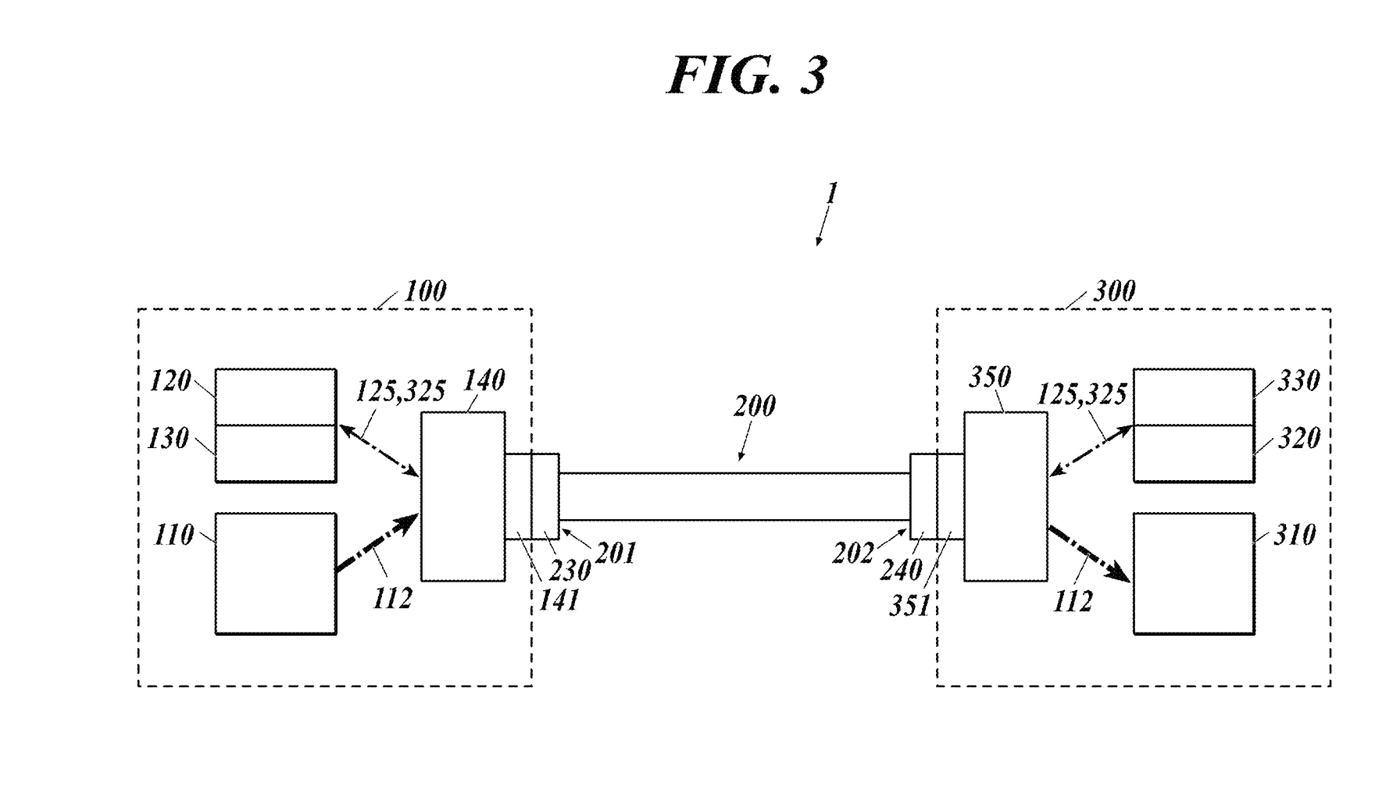
FIG. 3 is a block diagram of the power over fiber system according to the second embodiment of the present disclosure and shows optical connectors and so forth.

As shown in FIG. 3, the first data communication device 100 includes a light input/output part 140 and an optical connector 141 attached to the light input/output part 140, and the second data communication device 300 includes a light input/output part 350 and an optical connector 351 attached to the light input/output part 350. An optical connector 230 provided at the one end 201 of the optical fiber cable 200 is connected to the optical connector 141, and an optical connector 240 provided at the other end 202 of the optical fiber cable 200 is connected to the optical connector 351. The light input/output part 140 guides the feed light 112 to the cladding 220, guides the signal light 125 to the core 210, and guides the signal light 325 to the receiver 130. The light input/output part 350 guides the feed light 112 to the powered device 310, guides the signal light 125 to the receiver 330, and guides the signal light 325 to the core 210.

As described above, the optical fiber cable 200 has the one end 201 connectable to the first data communication device 100 and the other end 202 connectable to the second data communication device 300 to transmit the feed light 112. In this embodiment, the optical fiber cable 200 transmits the signal light 125, 325 bidirectionally.

As the semiconductor materials of the semiconductor regions, which exhibit the light-electricity conversion effect, of the semiconductor laser 111 and the photoelectric conversion element 311, any of those described in the first embodiment can be used, thereby achieving a high optical power supply efficiency.

Figure 4:
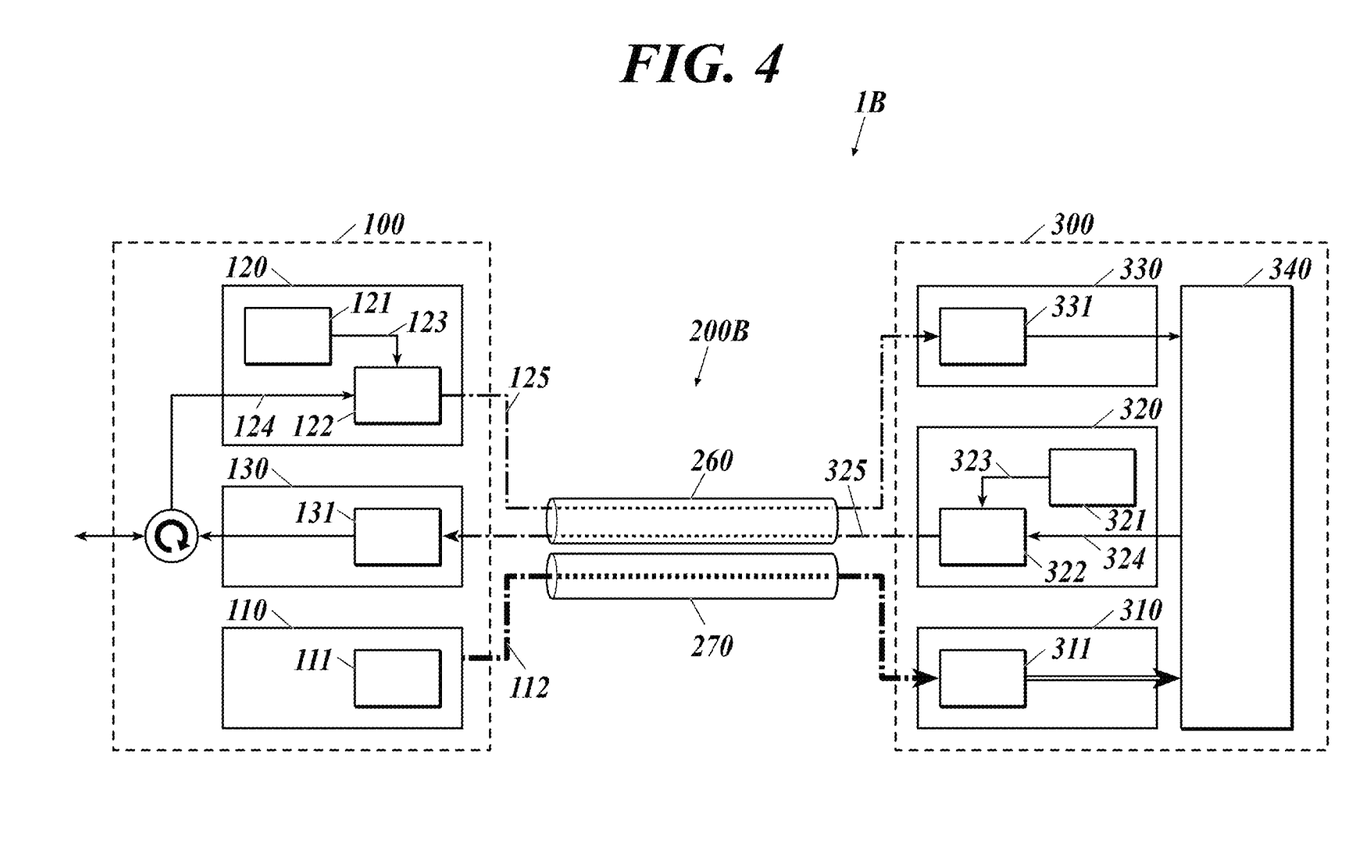
FIG. 4 is a block diagram of a power over fiber system according to another embodiment of the present disclosure.

Like an optical fiber cable 200B of a power over fiber system 1B shown in FIG. 4, an optical fiber 260 that transmits signal light and an optical fiber 270 that transmits feed light may be provided separately. Further, the optical fiber cable 200B may be composed of a plurality of optical fiber cables.

(2) Configuration to Convert Wavelength of Feed Light

[First Configuration Example Having Wavelength Conversion Function]

Next, a configuration to convert the wavelength of feed light will be described with reference to the drawings.

Figure 5:
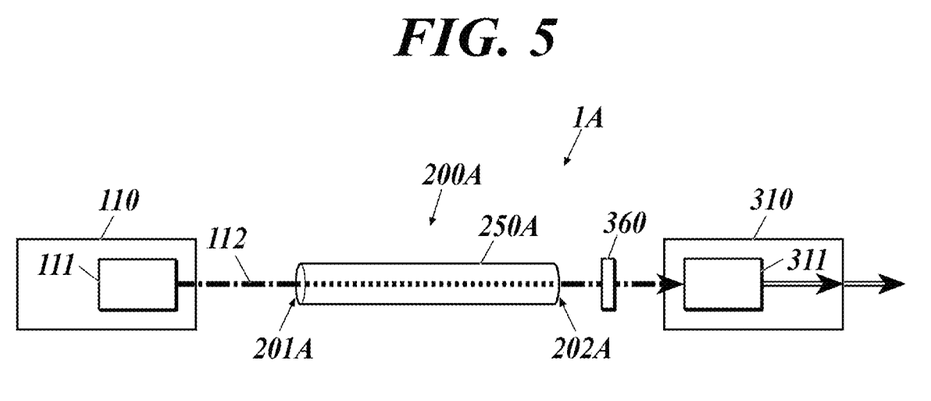
FIG. 5 is a block diagram of a first configuration example having a wavelength conversion function of the power over fiber system according to the first embodiment of the present disclosure.

FIG. 5 shows a first configuration example having a wavelength conversion function of the above-described power over fiber system 1A in which a converter 360 that converts the wavelength of feed light is disposed between the other end 202A of the optical fiber cable 200A and the photoelectric conversion element 311 of the powered device 310.

In the following description, as a general rule, components donated by the same reference signs as those of already-described components are the same as the already-described components unless otherwise stated.

As described above, as the semiconductor materials of the semiconductor laser 111 and the photoelectric conversion element 311, semiconductor materials having a laser wavelength being a short wavelength of 500 nm or less may be used. Further, semiconductor materials of laser media having a band gap of 2.4 eV to 6.2 eV, which are exemplified by diamond, gallium oxide, aluminum nitride and GaN, may be used.

Even if the conditions of the semiconductor materials of the semiconductor laser 111 and the photoelectric conversion element 311 are the same, a laser wavelength output by the semiconductor laser 111 and a laser wavelength at which the photoelectric conversion efficiency of the photoelectric conversion element 311 is maximized (hereinafter "photoelectric conversion efficiency maximizing wavelength") may not coincide.

Figure 6:
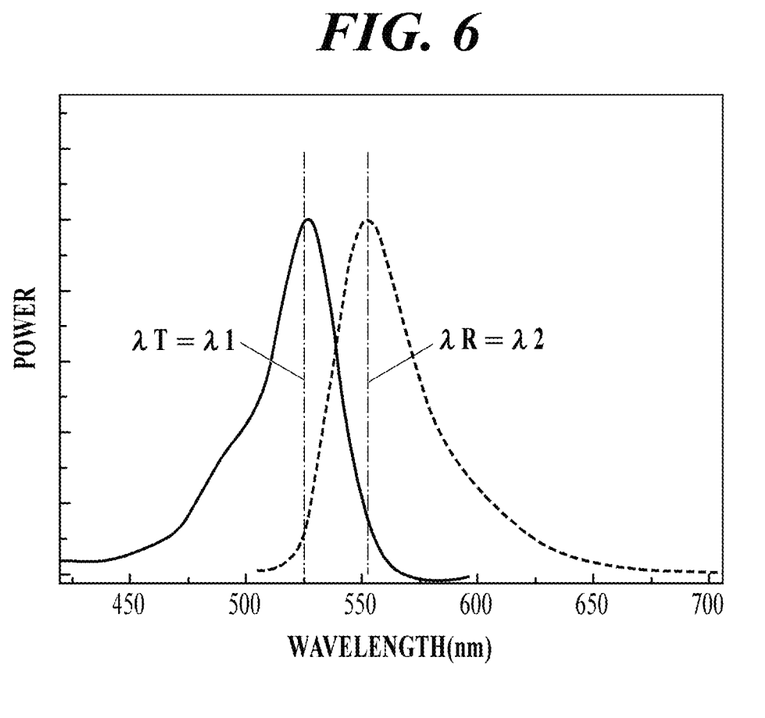
FIG. 6 is a line graph showing a relationship between laser wavelength of a semiconductor laser for power supply and output (power) thereof.

For example, as shown in FIG. 6, if the laser wavelength $\lambda T$ output by the semiconductor laser 111=$\lambda 1$, the photoelectric conversion efficiency maximizing wavelength $\lambda R$ of the photoelectric conversion element 311=$\lambda 2$, and $\lambda 1 \neq \lambda 2$, the photoelectric conversion efficiency decreases.

To deal with the above, the converter 360 is provided between the other end 202A of the optical fiber cable 200A and the photoelectric conversion element 311. The converter 360 converts the wavelength of the feed light 112 output from the semiconductor laser 111 and transmitted through the optical fiber cable 200A. The converter 360 converts the laser wavelength $\lambda 1$ output by the semiconductor laser 111 so as to make it coincide with or approximate to the photoelectric conversion efficiency maximizing wavelength $\lambda 2$ of the photoelectric conversion element 311 (shown in FIG. 6).

If the photoelectric conversion efficiency maximizing wavelength $\lambda 2$ of the photoelectric conversion element 311 is longer than the laser wavelength $\lambda 1$ of the semiconductor laser 111, the converter 360 that extends the laser wavelength $\lambda 1$ is used, whereas if the photoelectric conversion efficiency maximizing wavelength $\lambda 2$ of the photoelectric conversion element 311 is shorter than the laser wavelength $\lambda 1$ of the semiconductor laser 111, the converter 360 that shortens the laser wavelength $\lambda 1$ is used.

As the converter 360, phosphor is used, for example. Phosphor has a physical property of absorbing light having a specific wavelength and emitting light having a wavelength different from that of the absorbed light.

As shown in FIG. 6, the phosphor to be used has a property of performing Stokes shift on the feed light 112 from the laser wavelength $\lambda 1$ to the photoelectric conversion efficiency maximizing wavelength $\lambda 2$.

The phosphor may be either transmissive or reflective. As the converter 360, another component that performs wavelength conversion, such as an optical device capable of converting, by using a diffraction grating(s), the wavelength of laser light to be reflected, may be used.

Also, as the converter 360, nonlinear crystal (BBO crystal, LBO crystal, BiBO crystal, etc.) may be used. Nonlinear crystal is capable of shortening the laser wavelength $\lambda 1$ of the feed light 112.

Thus, the configuration having the converter 360 that converts the laser wavelength $\lambda 1$ of the feed light 112 can improve the photoelectric conversion efficiency in optical power supply.

For example, as in this first configuration example having a wavelength conversion function, the converter 360 disposed between the optical fiber cable 200A and the powered device 310 makes the laser wavelength λ1 of the feed light 112 coincide with or approximate to the photoelectric conversion efficiency maximizing wavelength λ2 of the photoelectric conversion element 311. This makes it possible to convert feed light into electric power with a higher efficiency and supply electric power with a higher efficiency.

Although reference has been made to the case where the conditions of the semiconductor materials of the semiconductor laser 111 and the photoelectric conversion element 311 are the same, this is not essential. The conditions of the semiconductor materials of the semiconductor laser 111 and the photoelectric conversion element 311 may be different. Even in such a case, the converter 360 configured to make the laser wavelength λ1 of the feed light coincide with or approximate to the photoelectric conversion efficiency maximizing wavelength λ2 of the photoelectric conversion element 311 makes it possible to convert the feed light into electric power with a higher efficiency.

[Second Configuration Example Having Wavelength Conversion Function]

Figure 7:
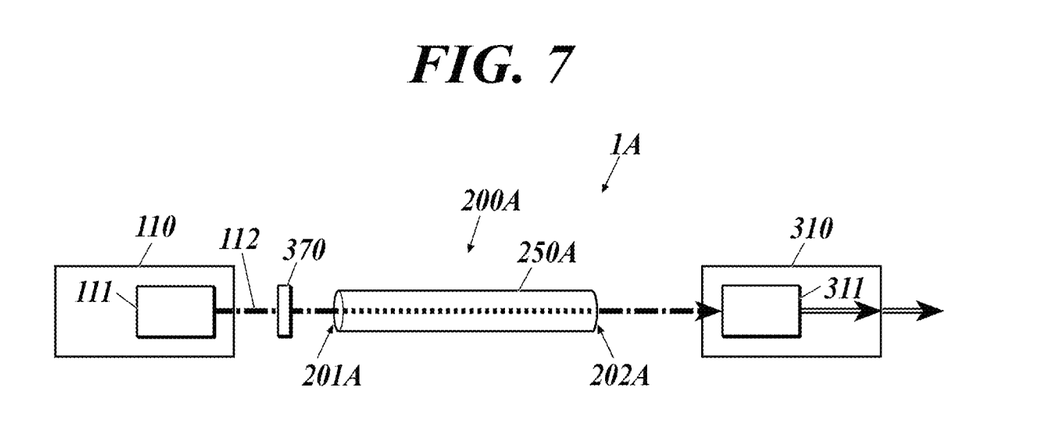
FIG. 7 is a block diagram of a second configuration example having a wavelength conversion function of the power over fiber system according to the first embodiment of the present disclosure.

FIG. 7 shows a second configuration example having a wavelength conversion function of the above-described power over fiber system 1A in which a converter 370 that converts the wavelength of the feed light 112 is disposed between the semiconductor laser 111 of the power sourcing equipment 110 and the one end 201A of the optical fiber cable 200A.

As described above, as the semiconductor material of the semiconductor laser 111, a semiconductor material having a laser wavelength being a short wavelength of 500 nm or less may be used. Further, a semiconductor material of a laser medium having a band gap of 2.4 eV to 6.2 eV, which is exemplified by diamond, gallium oxide, aluminum nitride and GaN, may be used.

Such a semiconductor laser 111 may have a high energy conversion efficiency. However, the transmission efficiency of short-wavelength laser is likely to decrease in the optical fiber cable 200A, and the longer the transmission length is, the larger the loss of the short-wavelength laser is.

To deal with the above, the converter 370 is provided between the semiconductor laser 111 and the one end 201A of the optical fiber cable 200A.

The converter 370 converts the laser wavelength of the feed light 112 output from the semiconductor laser 111 before entering the optical fiber cable 200A. The converter 370 converts the laser wavelength output by the semiconductor laser 111 so as to extend it.

As the converter 370, phosphor is used, for example. The phosphor may be either transmissive or reflective. As the converter 370, another component that performs wavelength conversion, such as an optical device capable of converting, by using a diffraction grating(s), the wavelength of laser light to be reflected, may be used.

As in this second configuration example having a wavelength conversion function, the converter 370 disposed between the power sourcing equipment 110 and the optical fiber cable 200A extends the laser wavelength λ1 of the feed light 112. This makes it possible to enhance the transmission efficiency of the feed light 112 that is transmitted in the optical fiber cable 200A, let the feed light 112 enter the powered device 310 with the loss reduced and supply electric power with a higher efficiency.

Further, the transmission length for power supply can be extended.

In the case where the converter 370 is provided, it is preferable that the condition of the semiconductor material of the photoelectric conversion element 311 be appropriately selected so as to make the photoelectric conversion efficiency maximizing wavelength of the photoelectric conversion element 311 of the powered device 310 be the same value as or an approximate value to the laser wavelength of the feed light 112 obtained by the conversion by the converter 370.

[Third Configuration Example Having Wavelength Conversion Function]

Figure 8:
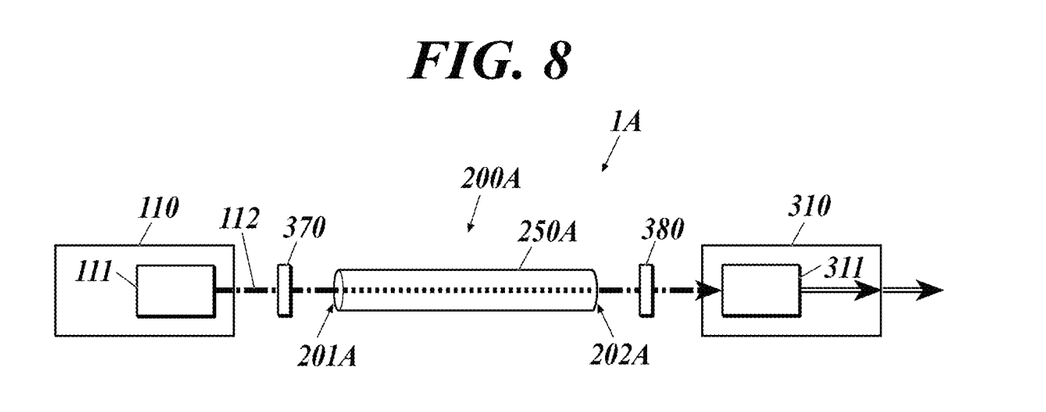
FIG. 8 is a block diagram of a third configuration example having a wavelength conversion function of the power over fiber system according to the first embodiment of the present disclosure.

FIG. 8 shows a third configuration example having a wavelength conversion function of the above-described power over fiber system 1A in which a converter 380 is disposed between the other end 202A of the optical fiber cable 200A and the photoelectric conversion element 311 of the powered device 310, and a converter 370 is disposed between the semiconductor laser 111 of the power sourcing equipment 110 and the one end 201A of the optical fiber cable 200A.

As the converter 370, as described above, phosphor or another component that performs wavelength conversion, such as an optical device that converts the wavelength of laser light, may be used.

As the converter 380, as described above, phosphor, nonlinear crystal or another component that performs wavelength conversion, such as an optical device that converts the wavelength of laser light, may be used.

As the converter 370, one having a property of extending the laser wavelength of the feed light 112 output from the semiconductor laser 111 before entering the optical fiber cable 200A is selected.

As the converter 380, one having a property of shortening the wavelength of the feed light 112 transmitted through the optical fiber cable 200A is selected.

As in this third configuration example having a wavelength conversion function, the converters 380, 370 disposed at the respective sides of the optical fiber cable 200A make it possible to enhance the transmission efficiency of the feed light 112 that is transmitted in the optical fiber cable 200A.

Further, since the laser wavelength extended by the converter 370 can be shortened by the converter 380, the conditions of the semiconductor materials of the semiconductor laser 111 and the photoelectric conversion element 311 may be the same. For example, even if, for each of the semiconductor laser 111 and the photoelectric conversion element 311, a semiconductor material having a laser wavelength being a short wavelength of 500 nm or less, which can provide a high photoelectric conversion efficiency, or a semiconductor material of a laser medium having a band gap of 2.4 eV to 6.2 eV, which is exemplified by diamond, gallium oxide, aluminum nitride and GaN, is selected, the laser wavelength can be made to coincide with or approximate to the photoelectric conversion efficiency maximizing wavelength.

The improvement of the transmission efficiency and the improvement of the photoelectric conversion efficiency bring achievement of electric power supply by optical power supply with a higher efficiency.

If the photoelectric conversion efficiency maximizing wavelength of the photoelectric conversion element 311 is longer than the wavelength extended by the converter 370, as the converter 380, one having a property of making the laser wavelength longer may be selected.

[Fourth Configuration Example Having Wavelength Conversion Function]

Figure 9:
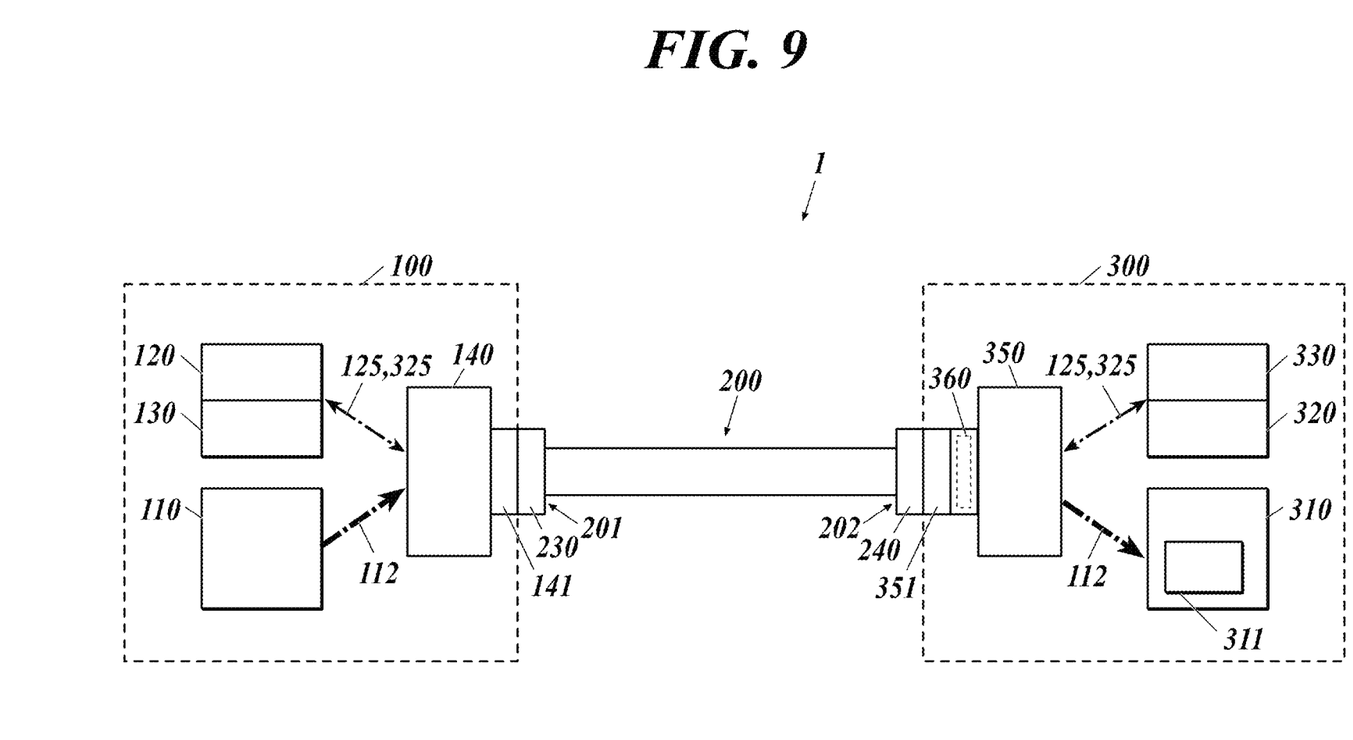
FIG. 9 is a block diagram of a fourth configuration example having a wavelength conversion function of the power over fiber system according to the second embodiment of the present disclosure.

FIG. 9 shows a fourth configuration example having a wavelength conversion function of the above-described power over fiber system 1 in which a converter 360 that converts the wavelength of feed light is disposed between the other end 202 of the optical fiber cable 200 and the photoelectric conversion element 311 of the powered device 310.

The converter 360 is the same as that illustrated with the first configuration example having a wavelength conversion function shown in FIG. 5.

The converter 360 is disposed between the light input/output part 350 and the optical connector 351 such that the feed light 112 transmitted through the optical fiber cable 200 enters the converter 360. The converter 360 converts the laser wavelength λ1 of the feed light 112 so as to make it coincide with or approximate to the photoelectric conversion efficiency maximizing wavelength λ2 of the photoelectric conversion element 311.

As far as it does not affect the signal light 125/325, the converter 360 may be disposed between the other end 202 of the optical fiber cable 200 and the optical connector 240 or between the light input/output part 350 and the powered device 310.

In this fourth configuration example having a wavelength conversion function, as in the first configuration example having a wavelength conversion function, the converter 360 makes the laser wavelength λ1 of the feed light 112 coincide with or approximate to the photoelectric conversion efficiency maximizing wavelength λ2 of the photoelectric conversion element 311. This makes it possible to convert feed light into electric power with a higher efficiency.

[Fifth Configuration Example Having Wavelength Conversion Function]

Figure 10:
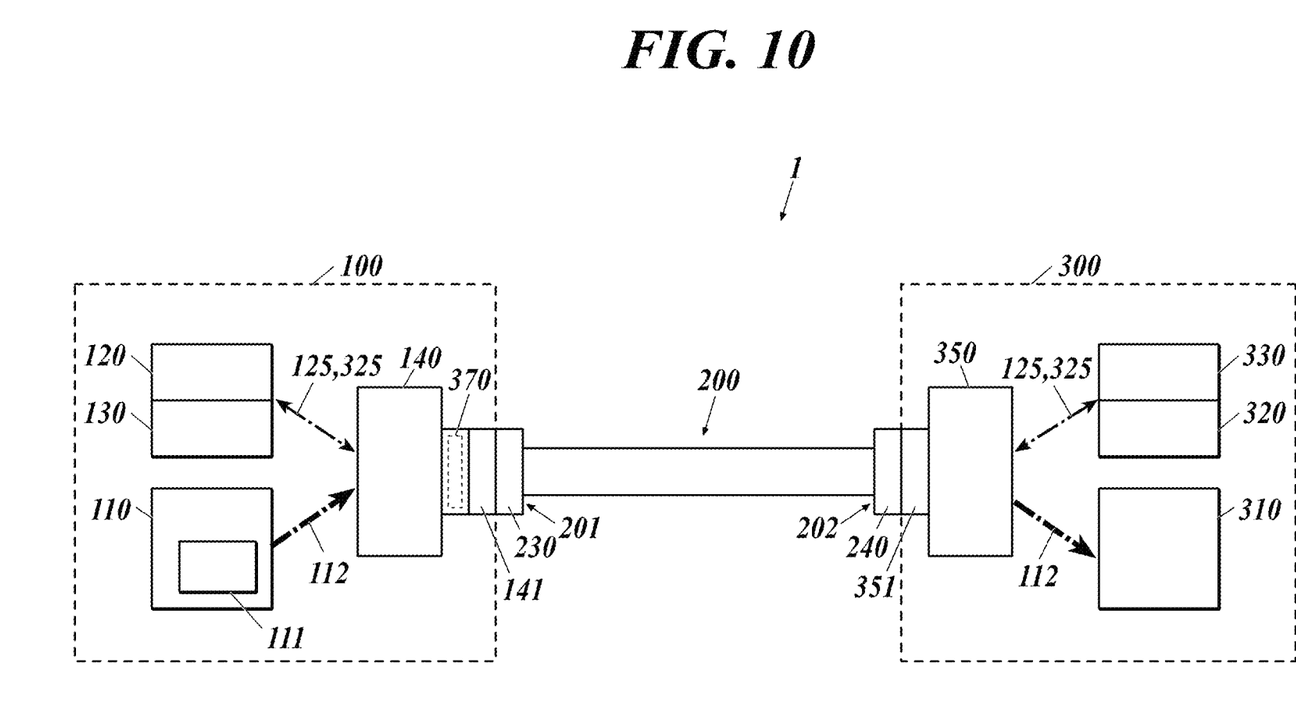
FIG. 10 is a block diagram of a fifth configuration example having a wavelength conversion function of the power over fiber system according to the second embodiment of the present disclosure.

FIG. 10 shows a fifth configuration example having a wavelength conversion function of the above-described power over fiber system 1 in which a converter 370 that converts the wavelength of feed light is disposed between the semiconductor laser 111 of the power sourcing equipment 110 and the one end 201 of the optical fiber cable 200.

The converter 370 is the same as that illustrated with the second configuration example having a wavelength conversion function shown in FIG. 7.

The converter 370 is disposed between the light input/output part 140 and the optical connector 141 such that the feed light 112 enters the converter 370 before entering the optical fiber cable 200. The converter 370 converts the laser wavelength λ1 of the feed light 112 so as to extend it.

As far as it does not affect the signal light 125/325, the converter 370 may be disposed between the optical connector 230 and the one end 201 of the optical fiber cable 200 or between the light input/output part 140 and the power sourcing equipment 110.

In this fifth configuration example having a wavelength conversion function, as in the second configuration example having a wavelength conversion function, the converter 370 extends the laser wavelength λ1 of the feed light 112. This makes it possible to reduce the loss of the feed light 112 that is transmitted in the optical fiber cable 200 and supply electric power with a higher efficiency.

[Sixth Configuration Example Having Wavelength Conversion Function]

Figure 11:
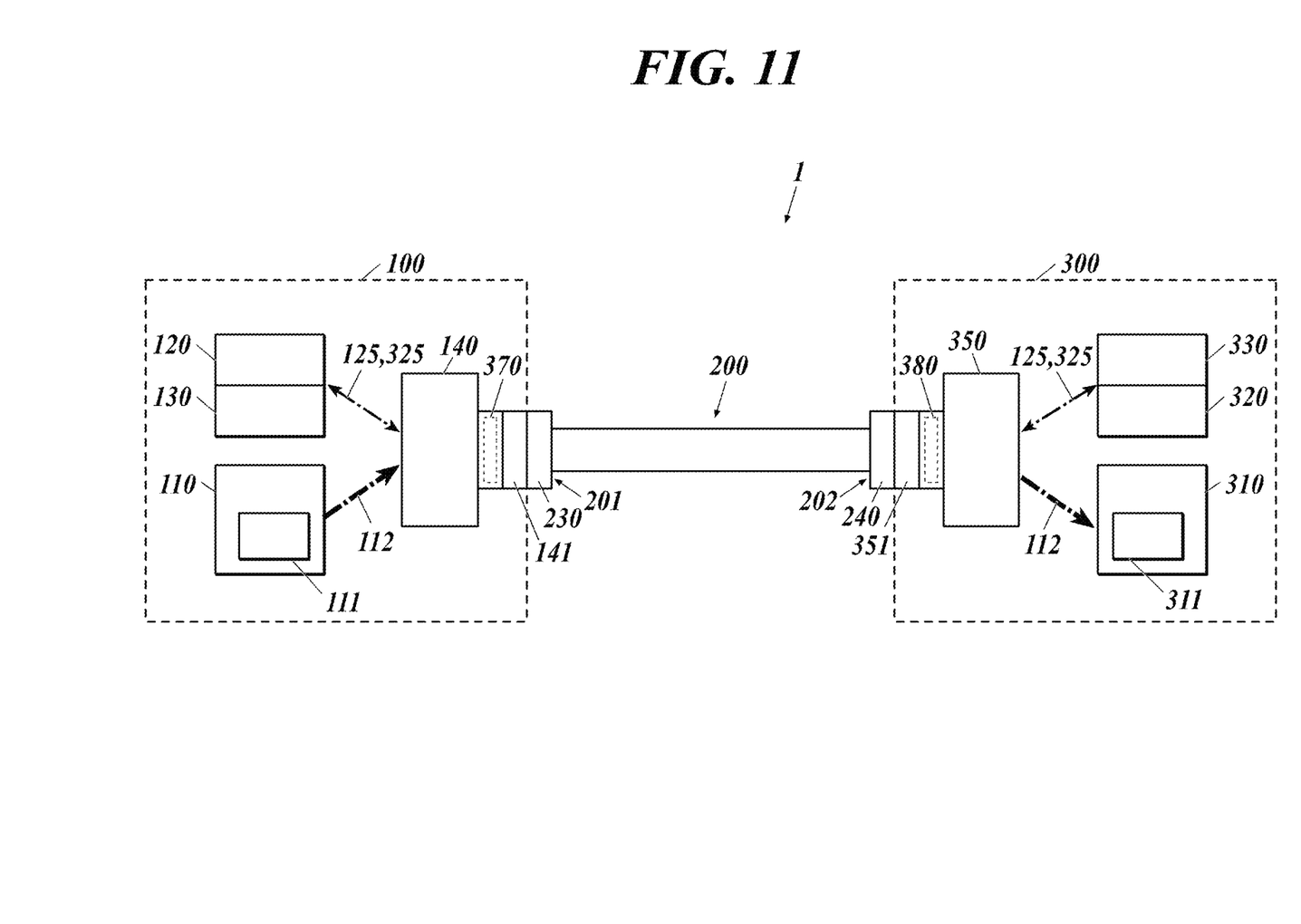
FIG. 11 is a block diagram of a sixth configuration example having a wavelength conversion function of the power over fiber system according to the second embodiment of the present disclosure.

FIG. 11 shows a sixth configuration example having a wavelength conversion function of the above-described power over fiber system 1 in which a converter 380 is disposed between the other end 202 of the optical fiber cable 200 and the photoelectric conversion element 311, and a converter 370 is disposed between the semiconductor laser 111 and the one end 201 of the optical fiber cable 200.

The converters 380, 370 are the same as those illustrated with the third configuration example having a wavelength conversion function shown in FIG. 8.

The converter 380 is disposed between the light input/output part 350 and the optical connector 351, and the converter 370 is disposed between the light input/output part 140 and the optical connector 141.

The converter 370 extends the laser wavelength of the feed light 112, and the converter 380 shortens the wavelength of the feed light 112.

In this case too, as far as it does not affect the signal light 125/325, the converter 380 may be disposed between the other end 202 of the optical fiber cable 200 and the optical connector 240 or between the light input/output part 350 and the powered device 310.

Also, as far as it does not affect the signal light 125/325, the converter 370 may be disposed between the optical connector 230 and the one end 201 of the optical fiber cable 200 or between the light input/output part 140 and the power sourcing equipment 110.

In this sixth configuration example having a wavelength conversion function, as in the third configuration example having a wavelength conversion function, the improvement of the transmission efficiency and the improvement of the photoelectric conversion efficiency bring achievement of electric power supply by optical power supply with a higher efficiency.

[Relationship between Converter and Signal Light]

The above-described power over fiber system 1 shown in each of FIG. 9 to FIG. 11 is configured such that the converter(s) 360, 370 and/or 380 does not affect the signal light 125/325, but this is not a limitation.

For example, the conditions of the semiconductor materials of the semiconductor lasers 121, 321 of the transmitters 120, 320 and the semiconductor laser 111 of the power sourcing equipment 110 may be the same, and the conditions of the semiconductor materials of the photodiodes 131, 331 and the photoelectric conversion element 311 of the powered device 310 may be the same.

More specifically, if, as each of the semiconductor materials of the semiconductor lasers 121, 321 and the photoelectric conversion element 311, a semiconductor material having a laser wavelength being a short wavelength of 500 nm or less or a semiconductor material of a laser medium having a band gap of 2.4 eV to 6.2 eV, which is exemplified by diamond, gallium oxide, aluminum nitride and GaN, is used, the laser wavelength of the signal light 125/325 may also be converted like the feed light 112.

Figure 12:
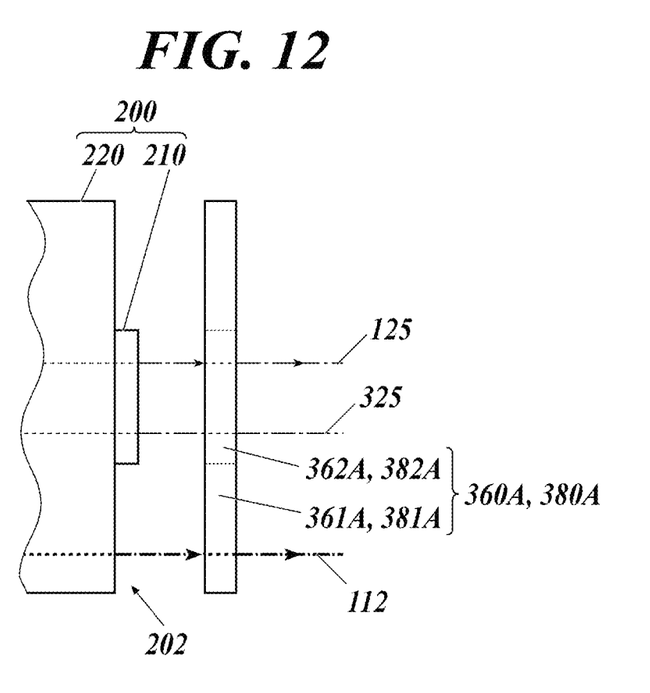
FIG. 12 is a block diagram showing another example of a converter disposed between an optical fiber cable and a photoelectric conversion element.

In this case, for example, as shown in FIG. 12, between the other end 202 of the optical fiber cable 200 and the photoelectric conversion element 311 of the powered device 310, a converter 360A (or 380A) may be provided instead of the converter 360 (or 380).

The converter 360A (or 380A) has a region 361A (or 381A) that converts the laser wavelength of the feed light 112 and a region 362A (or 382A) that converts the laser wavelength of the signal light 125/325. The boundary between the region 361A (or 381A) and the region 362A (or 382A) is optically shielded so that the feed light 112 and the signal light 125/325 do not interfere with one another.

Figure 13:
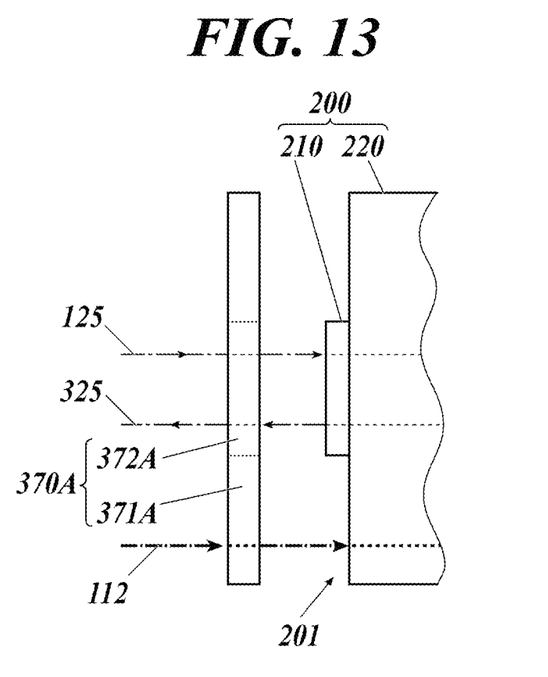
FIG. 13 is a block diagram showing another example of a converter disposed between a power sourcing equipment and an optical fiber cable.

Similarly, as shown in FIG. 13, between the one end 201 of the optical fiber cable 200 and the semiconductor laser 111 of the power sourcing equipment 110, a converter 370A may be provided instead of the converter 370.

The converter 370A has a region 371A that converts the laser wavelength of the feed light 112 and a region 372A that converts the laser wavelength of the signal light 125/325. The boundary between the region 371A and the region 372A is optically shielded so that the feed light 112 and the signal light 125/325 do not interfere with one another.

For the feed light 112 and the signal light 125/325, separate converters may be provided.

Thus, the configuration to also convert the wavelength of the signal light 125/325 can improve the transmission efficiency of the signal light 125/325 and/or improve the photoelectric conversion efficiency, and enables stable communication.

Further, the configuration makes it possible to match the conditions of the semiconductor materials of the semiconductor lasers 121, 321 of the transmitters 120, 320 and the photodiodes 131, 331 with the conditions of the semiconductor materials of the semiconductor laser 111 and the photoelectric conversion element 311. This enables standardization of the parts/components and improvement of the system efficiency.

Although some embodiments of the present disclosure have been described above, these embodiments are made for purposes of illustration and example only. The present invention can be carried out in various other forms, and each component may be omitted, replaced or modified/changed within a range not departing from the scope of the present invention.

For example, although FIG. 9 to FIG. 11 show configuration examples each having a wavelength conversion function applied to the power over fiber system 1, they are also applicable to the power over fiber system 1B in the same manner.

INDUSTRIAL APPLICABILITY

An optical power supply system according to the present invention has industrial applicability to an optical power supply system that changes a laser wavelength to supply power.

REFERENCE SIGNS LIST 1, 1A, 1B Power over Fiber System
100 First Data Communication Device
110 Power Sourcing Equipment
111 Semiconductor Laser for Power Supply
112 Feed Light
120 Transmitter
121 Semiconductor Laser for Signals
124 Transmission Data
125 Signal Light
130 Receiver
131 Photodiode for Signals
140 Light Input/Output Part
200, 200A, 200B Optical Fiber Cable
210 Core
220 Cladding
250, 250A, 260, 270 Optical Fiber
300 Second Data Communication Device
310 Powered Device
311 Photoelectric Conversion Element
320 Transmitter
321 Semiconductor Laser for Signals
324 Transmission Data
325 Signal Light
330 Receiver
331 Photodiode for Signals
340 Data Processing Unit
350 Light Input/Output Part
360, 360A, 370, 370A, 380, 380A Converter

The invention claimed is:

1. A power over fiber system, comprising:
a power sourcing equipment including a semiconductor laser that is configured to oscillate with electric power, thereby outputting feed light;
a powered device including a photoelectric conversion element that is configured to convert the feed light into electric power;
an optical fiber cable having one end connectable to the power sourcing equipment and another end connectable to the powered device to transmit the feed light; and
a first converter that is configured to extend a wavelength of the feed light output from the semiconductor laser before entering the optical fiber cable to a first wavelength of the feed light to be transmitted through the optical fiber cable; and
a second converter that is configured to shorten the first wavelength of the feed light output from the optical fiber cable to a second wavelength of the feed light.

2. The power over fiber system according to claim 1, wherein the second converter is disposed between the optical fiber cable and the powered device.

3. The power over fiber system according to claim 1, wherein the first converter is disposed between the power sourcing equipment and the optical fiber cable.

4. The power over fiber system according to claim 1, wherein the first converter is disposed between the power sourcing equipment and the optical fiber cable and the second converter is disposed between the optical fiber cable and the powered device.

5. The power over fiber system according to claim 1, wherein a semiconductor material of a semiconductor region of the semiconductor laser, the semiconductor region exhibiting a light-electricity conversion effect, is a laser medium having a laser wavelength of 500 nm or less.

6. The power over fiber system according to claim 1, wherein a semiconductor material of a semiconductor region of the photoelectric conversion element, the semiconductor region exhibiting a light-electricity conversion effect, is a laser medium having a laser wavelength of 500 nm or less.

7. The power over fiber system according to claim 2, wherein a semiconductor material of a semiconductor region of the semiconductor laser, the semiconductor region exhibiting a light-electricity conversion effect, is a laser medium having a laser wavelength of 500 nm or less.

8. The power over fiber system according to claim 3, wherein a semiconductor material of a semiconductor region of the semiconductor laser, the semiconductor region exhibiting a light-electricity conversion effect, is a laser medium having a laser wavelength of 500 nm or less.

9. The power over fiber system according to claim 4, wherein a semiconductor material of a semiconductor region of the semiconductor laser, the semiconductor region exhibiting a light-electricity conversion effect, is a laser medium having a laser wavelength of 500 nm or less.

10. The power over fiber system according to claim 2, wherein a semiconductor material of a semiconductor region of the photoelectric conversion element, the semiconductor region exhibiting a light-electricity conversion effect, is a laser medium having a laser wavelength of 500 nm or less.

11. The power over fiber system according to claim 3, wherein a semiconductor material of a semiconductor region of the photoelectric conversion element, the semiconductor region exhibiting a light-electricity conversion effect, is a laser medium having a laser wavelength of 500 nm or less.

12. The power over fiber system according to claim 4, wherein a semiconductor material of a semiconductor region of the photoelectric conversion element, the semiconductor region exhibiting a light-electricity conversion effect, is a laser medium having a laser wavelength of 500 nm or less.

13. The power over fiber system according to claim 5, wherein a semiconductor material of a semiconductor region of the photoelectric conversion element, the semiconductor region exhibiting a light-electricity conversion effect, is a laser medium having a laser wavelength of 500 nm or less.

14. The power over fiber system according to claim 7, wherein a semiconductor material of a semiconductor region of the photoelectric conversion element, the semiconductor region exhibiting a light-electricity conversion effect, is a laser medium having a laser wavelength of 500 nm or less.

15. The power over fiber system according to claim 8, wherein a semiconductor material of a semiconductor region of the photoelectric conversion element, the semiconductor region exhibiting a light-electricity conversion effect, is a laser medium having a laser wavelength of 500 nm or less.

16. The power over fiber system according to claim 9, wherein a semiconductor material of a semiconductor region of the photoelectric conversion element, the semiconductor region exhibiting a light-electricity conversion effect, is a laser medium having a laser wavelength of 500 nm or less.

\* \* \* \* \*